US008331882B1

(12) United States Patent
McCune et al.

(10) Patent No.: US 8,331,882 B1
(45) Date of Patent: Dec. 11, 2012

(54) VSWR NORMALIZING ENVELOPE MODULATOR

(75) Inventors: Earl W. McCune, Santa Clara, CA (US); Richard W. D. Booth, Los Gatos, CA (US)

(73) Assignee: Panasonic Corporation, Osaka (JP)

( * ) Notice: Subject to any disclaimer, the term of this patent is extended or adjusted under 35 U.S.C. 154(b) by 1200 days.

(21) Appl. No.: 11/821,301

(22) Filed: Jun. 22, 2007

(51) Int. Cl.
*H01Q 11/12* (2006.01)

(52) U.S. Cl. ............... 455/127.1; 455/115.1; 455/115.2; 455/115.3; 455/126; 455/522; 455/127.2; 455/67.11; 455/67.13; 455/67.14; 330/129; 330/285; 330/278; 330/297; 330/291; 330/279

(58) Field of Classification Search .... 455/115.1–115.4, 455/126, 522, 117, 127, 1–127.4, 234.2, 455/239.1, 240.1, 232.1, 67.11, 67.13, 67.14, 455/37.14, 67.7; 330/129, 285, 278, 297, 330/102, 291, 279
See application file for complete search history.

(56) References Cited

U.S. PATENT DOCUMENTS

| | | | |
|---|---|---|---|
| 4,355,303 A | 10/1982 | Phillips et al. ............ 340/310 A |
| 4,503,398 A | 3/1985 | Akram | |
| 5,079,497 A | 1/1992 | Barbu et al. ................... 323/381 |
| 5,175,879 A | 12/1992 | Ellingson et al. ............. 455/341 |
| 5,302,913 A | 4/1994 | Hori ............................... 330/129 |
| 5,432,473 A | 7/1995 | Mattila et al. | |
| 5,548,205 A | 8/1996 | Monticelli ..................... 323/274 |
| 5,564,087 A | 10/1996 | Cygan et al. .................. 455/126 |
| 5,589,796 A | 12/1996 | Alberth, Jr. et al. | |
| 5,613,229 A * | 3/1997 | Baranowski et al. ....... 455/127.1 |
| 5,942,946 A | 8/1999 | Su et al. | |
| 6,081,161 A * | 6/2000 | Dacus et al. ................... 330/297 |
| 6,173,056 B1 | 1/2001 | Romesburg et al. | |
| 6,236,266 B1 | 5/2001 | Choumei et al. | |
| 6,351,189 B1 | 2/2002 | Hirvilampi | |
| 6,430,402 B1 * | 8/2002 | Agahi-Kesheh ........... 455/115.3 |
| 6,452,457 B1 * | 9/2002 | Chabas ........................ 330/297 |
| 6,528,975 B2 | 3/2003 | Sander .......................... 323/281 |
| 6,639,466 B2 | 10/2003 | Johnson | |
| 6,651,021 B2 | 11/2003 | Underbrink et al. | |
| 6,882,220 B2 | 4/2005 | Doherty et al. | |
| 6,897,730 B2 * | 5/2005 | Dupuis et al. ................. 330/297 |
| 7,046,090 B2 * | 5/2006 | Veinblat ........................ 330/285 |
| 7,091,790 B2 | 8/2006 | Doherty et al. | |
| 7,123,095 B2 | 10/2006 | Tsutsui et al. | |
| 7,193,471 B2 | 3/2007 | Tsutsui et al. | |
| 7,363,012 B2 * | 4/2008 | Ando .............................. 455/69 |
| 7,557,653 B2 * | 7/2009 | Camuffo et al. .............. 330/129 |
| 7,688,136 B2 * | 3/2010 | Langer et al. ................. 330/129 |
| 2003/0090325 A1 * | 5/2003 | Canyon et al. ................ 330/285 |
| 2005/0242882 A1 * | 11/2005 | Anderson ..................... 330/285 |
| 2006/0234626 A1 * | 10/2006 | Goldberg et al. ............. 455/13.4 |
| 2007/0030068 A1 * | 2/2007 | Motonobu et al. ............ 330/257 |

* cited by examiner

*Primary Examiner* — Junpeng Chen

(57) ABSTRACT

A relationship is established between measurable characteristics of the DC power input to a power amplifier and the RF output power level. A power circuit is configured to measure the input supply current to the power amplifier and to utilize the relationship between the input supply current and the applied input supply voltage to the output power level, thereby normalizing the output power of an amplified communication signal.

3 Claims, 6 Drawing Sheets

VSWR NORMALIZING ENVELOPE MODULATOR

FIELD OF THE INVENTION

The present invention relates to power amplification circuits, and more particularly, to a power amplification circuit configured to normalize an output power.

BACKGROUND OF THE INVENTION

The power delivered by a power amplifier to a load resistance depends on the voltage standing wave ratio (VSWR), that is, the change in the magnitude and phase of the reflection coefficient referenced to the designed load resistance, also referred to as the nominal load resistance or the nominal load impedance. System requirements that demand the leveling of this output power as the load impedance changes present difficult circuit design problems which are particularly troublesome in a cost sensitive environment. Measuring the VSWR directly at the output of the power amplifier, using well-known radio frequency (RF) VSWR measurement methods, adds cost in terms of a dual directional coupler, detection diodes or dual logarithmic amplifiers, and other overhead such as additional analog to digital conversion(s).

Many applications require an output signal with a consistent power level. One such application is a cellular network in which a cellular telephone includes a power amplifier coupled to an antenna. The antenna in this case is the load. FIG. 1 illustrates an exemplary configuration in which a power amplifier 10 is coupled to an antenna 30. An RF input signal is input to the power amplifier 10. A supply voltage is provided from the power supply 20 to power the power amplifier 10. The power amplifier amplifies the input RF signal and outputs an amplified RF output signal which is transmitted by the antenna 30. Under ideal conditions, the actual output load impedance at the output of the power amplifier is the same as the nominal load impedance Z0, as illustrated in the FIG. 2A. In this case, the RF output signal is transmitted from the antenna 30 at an output power that is within expected parameters.

However, as is well known in the art, the RF output signal transmitted via the antenna can vary in power from its nominal operating parameters. In such cases, the actual output load impedance is some load impedance Z1 different than the expected nominal load impedance Z0. This is referred to as a mismatched load impedance. In many cases, such a mismatch can be quite substantial and will negatively impact the performance of the system. FIG. 2B illustrates a mismatched load impedance condition. Whenever the actual output load impedance Z1 is different than the nominal load impedance Z0, a portion of the output power is reflected back toward the power amplifier 10. The remaining portion of the output power is transmitted through the antenna 30, whereby the output power of the transmitted signal is reduced. Many systems require a consistent transmitted signal, or a signal power within a particular range. Additionally, the reflected power is potentially harmful to the power amplifier, leading to possible damage or destruction.

To compensate for mismatch load conditions, it is necessary to quantify the level of load mismatch and then to adjust the power input to the power amplifier accordingly. A conventional method of quantifying the load mismatch is to add a detection circuit at the output of the power amplifier. FIG. 3 illustrates a conventional circuit configuration for measuring a mismatched load impedance of a power amplifier. A detection circuit is added at the output of the power amplifier 10. The detection circuit includes a coupler 40, a first diode 50, and a second diode 60. The detection circuit functions to measure the amount of power $P_f$ in the forward direction, that is, from the power amplifier 10 to the antenna 30, and to measure the amount of power $P_r$ in the reverse direction, that is, from the antenna 30 to the power amplifier 10. The reverse power $P_r$ is the reflected power resulting from the mismatched load impedance. The measured forward power $P_f$ and the reverse power $P_r$ are used to calculate the actual output load impedance, which in turn is used to adjust the supply voltage provided by the power supply 20 to the power amplifier 10. Ideally, the reverse power $P_r$ is zero, and the forward power $P_f$ is the nominal output power.

There are many problems associated with using a detection circuit, such as that of FIG. 3, at the output of the power amplifier. There are many additional parts which adds complexity, size, and cost. Each of the additional parts exhibits performance characteristics that may or may not be known, there are additional manufacturing considerations associated with the additional parts, and some of the additional parts, such as the diodes, are temperature dependent. Further, the detection circuit results in some power loss, so that even under ideal conditions the output power is reduced leading to an overall drop in efficiency. Also, use of a detection circuit requires additional logic circuitry necessary to perform the additional calculations. These are just a sampling of the problems associated with conventional detection circuits.

SUMMARY OF THE INVENTION

A relationship is established between measurable characteristics of the power input to a power amplifier and the output power level. A power circuit is configured to measure the input supply current to the power amplifier and to utilize the relationship between the input supply current and the applied input supply voltage to the output power level, thereby normalizing the output power of an amplified communication signal.

In one aspect, a power amplification circuit comprises a power supply including a variable supply voltage and a supply current, a power amplifier configured to receive a communication signal and supply voltage from the power supply, and to output an amplified communication signal, a load coupled to the output of the power amplifier, wherein the load includes a nominal load resistance, a current sensing circuit coupled between the power supply and the power amplifier, wherein the current sensing circuit is configured to measure the supply current from the power supply to the power amplifier and a control circuit configured to adjust the supply voltage provided by the power supply to an adjusted supply voltage based on the measured supply current and a nominal supply current. The control circuit is configured to compare the measured supply current to the nominal supply current, wherein the nominal supply current corresponds to the supply voltage and the nominal load resistance, wherein the control circuit is further configured to adjust the supply voltage provided by the power supply if the measured supply current does not equal the nominal supply current, thereby normalizing the power of the amplified communication signal within a predetermined range. In the power amplification circuit a memory is also coupled to the control circuit, wherein the memory includes a look-up table configured to associate specific supply voltages with corresponding nominal supply currents. The control circuit is further configured to calculate a difference between the measured supply current and the nominal supply current and to determine a level of adjustment of the supply voltage according to the calculated difference.

The control circuit is configured to lower the supply voltage by the level of adjustment when the measured supply current is greater than the nominal supply current. The control circuit is configured to raise the supply voltage by the level of adjustment when the measured supply current is less than the nominal supply current. The control circuit is configured to maintain the product of the supply voltage and the measured supply current at a constant value, thereby normalizing the power of the amplified communication signal within the predetermined range. The power amplifier is operating in compression. The power amplification circuit further comprises a memory configured to store related supply voltage, supply currents, and correction factors, wherein a control circuit configured to calculate a difference between the measured supply current and the nominal supply current corresponding to the supply voltage and the nominal load resistance, to retrieve from memory a new supply voltage that corresponds to the measured supply current, to retrieve from memory a correction factor that corresponds to the difference between the measured supply current and the nominal supply current, to calculate an adjusted supply voltage according to the new supply voltage and the retrieved correction factor, and to adjust the supply voltage provided by the power supply to the adjusted supply voltage, thereby normalizing a power level of the amplified communication signal at a constant value. In some embodiments, the adjusted supply voltage is lowered when the measured supply current is greater than the nominal supply current. In some embodiments, the adjusted supply voltage is raised when the measured supply current is less than the nominal supply current. The difference between the measured supply current and the nominal supply current includes a magnitude and a direction.

In another aspect, a power amplification circuit comprises a power supply including a variable supply voltage and a supply current, a power amplifier configured to receive a communication signal and an supply voltage from the power supply, and to output an amplified communication signal, a load coupled to the output of the power amplifier, a current sensing circuit coupled between the power supply and the power amplifier, wherein the current sensing circuit is configured to measure the supply current from the power supply to the power amplifier and a control circuit configured to adjust the supply voltage provided by the power supply based on the measured supply current. The control circuit is configured to adjust the supply voltage provided by the power supply to maintain a product between the measured supply current and an applied supply voltage provided by the power supply at a constant value, thereby normalizing a power output level of the amplified communication signal within a predetermined range. The power amplification circuit further comprises a memory configured to store related supply voltages, supply currents, and correction factors, wherein the control circuit configured to calculate an adjusted supply voltage according to a difference between the measured supply current and a nominal supply current retrieved from the memory, wherein the control circuit is further configured to adjust the supply voltage provided by the power supply to the adjusted supply voltage, thereby normalizing an output power level of the amplified communication signal at a constant value.

In yet another aspect, a mobile communication device comprises a signal generating circuit configured to generate a radio frequency communication signal, a power supply including a variable supply voltage and a supply current, a power amplifier configured to receive the communication signal from the signal generating circuit and an supply voltage from the power supply, and to output an amplified communication signal, an antenna coupled to the output of the power amplifier, a current sensing circuit coupled between the power supply and the power amplifier, wherein the current sensing circuit is configured to measure the supply current from the power supply to the power amplifier and a control circuit configured to adjust the supply voltage provided by the power supply based on the measured supply current. The control circuit is configured to adjust the supply voltage provided by the power supply to maintain a product between the measured supply current and an applied supply voltage provided by the power supply at a constant value, thereby normalizing a power output level of the amplified communication signal within a predetermined range. The mobile communication device further comprises a memory configured to store related supply voltages, supply currents, and correction factors, wherein the control circuit configured to calculate an adjusted supply voltage according to a difference between the measured supply current and a nominal supply current retrieved from the memory, wherein the control circuit is further configured to adjust the supply voltage provided by the power supply to the adjusted supply voltage, thereby normalizing an output power level of the amplified communication signal at a constant value.

In still yet another aspect, a method of normalizing a power output of an amplified signal comprises providing a communication signal to a power amplifier, providing a supply voltage from a power supply to the power amplifier, measuring a supply current from the power supply to the power amplifier and adjusting the supply voltage provided by the power supply based on the measure supply current. Adjusting the supply voltage is provided by the power supply to maintain a product between the measured supply current and an applied supply voltage provided by the power supply at a constant value, thereby normalizing a power output level of the power amplifier within a predetermined range. Adjusting the supply voltage further comprises calculating an adjusted supply voltage according to a difference between the measured supply current and a nominal supply current retrieved from memory and adjusting the supply voltage provided by the power supply to the adjusted supply voltage, thereby normalizing an output power level of the amplified communication signal at a constant value.

In another aspect, a method of normalizing a power output of an amplified signal, the method comprises providing a communication signal to a power amplifier, providing a supply voltage from a power supply to the power amplifier, measuring a supply current from the power supply to the power amplifier and adjusting the supply voltage provided by the power supply based on a nominal supply current and the measured supply current. Adjusting the supply voltage comprises comparing the measured supply current to the nominal supply current, wherein the nominal supply current corresponds to the supply voltage and a nominal load resistance at the output of the power amplifier and adjusting the supply voltage provided by the power supply if the measured supply current does not equal the nominal supply current, thereby normalizing a power output level of the power amplifier within a predetermined range. Adjusting the supply voltage further comprises calculating a difference between the measured supply current and the nominal supply current corresponding to the supply voltage and a nominal load resistance at the output of the power amplifier, retrieving from memory a new supply voltage that corresponds to the measured supply current, retrieving from memory a correction factor that corresponds to the difference between the measured supply current and the nominal supply current, calculating an adjusted supply voltage according to the new supply voltage and the retrieved correction factor and adjusting the supply voltage provided by the power supply to the adjusted supply voltage, thereby normalizing a power level of the amplified communication signal at a constant value.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION

Embodiments of the present invention are directed to a power amplification circuit to provide a normalized output power signal under mismatched load impedance conditions. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In the case of a power amplifier that is 100% efficient, all the DC input power is converted to RF output power. For the purposes of this application, it is established that in the case of an "efficient" power amplifier, a change in RF output power is directly linked to a change in DC input power. Similarly, the converse is also established, that changing the DC input power directly effects the RF output power. For the case of a less than 100% efficient power amplifier, this linkage is weaker. In general, such a linkage starts to perform when applied to power transistors with 40% efficiency and provides improved performance as this increases toward 100%. More generally, this technique corresponds to operation of the RF power transistor in compression. In general, the deeper the compressed operation, the higher the efficiency, and the stronger is the desired relationship between DC input and RF output powers.

Figure 1:
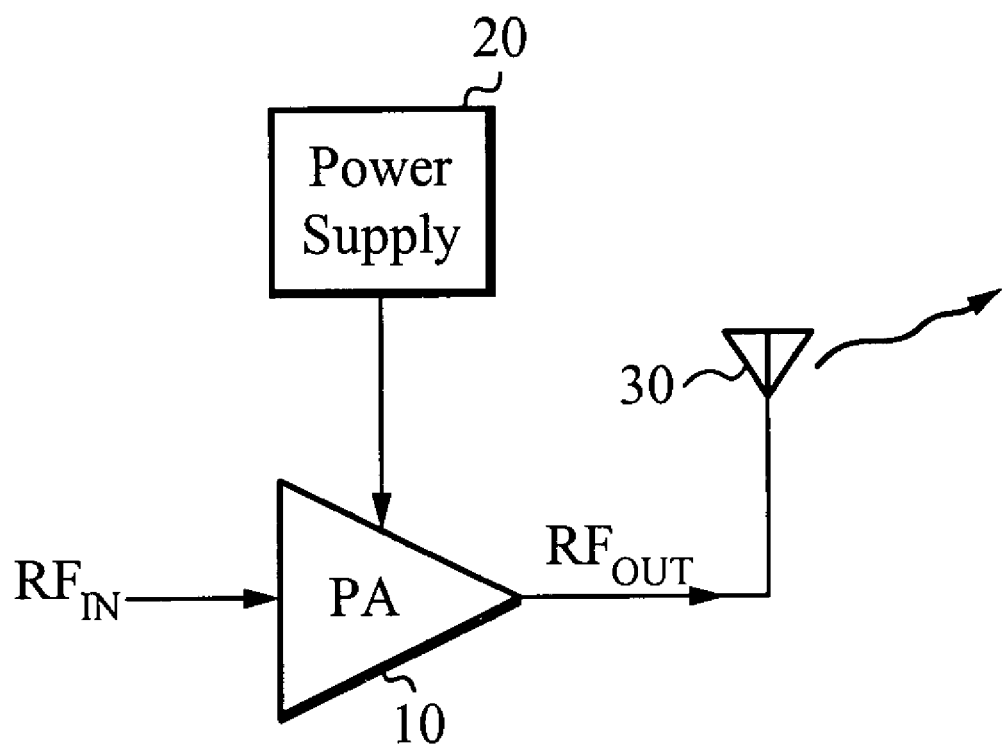
FIG. 1 illustrates an exemplary configuration in which a power amplifier is coupled to an antenna.
Figure 2A:
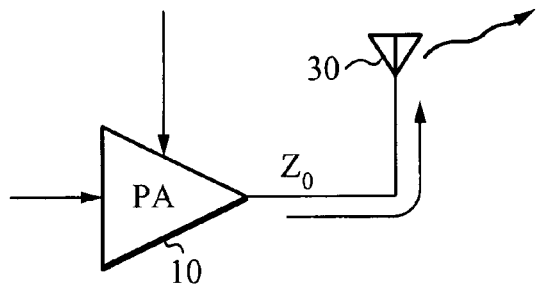
FIG. 2A illustrates the power amplifier of FIG. 1 operating under nominal conditions.
Figure 2B:
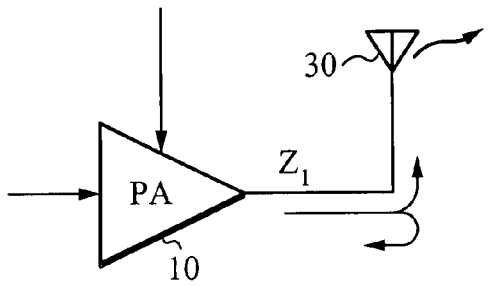
FIG. 2B illustrates the power amplifier of FIG. 1 operating under a mismatched load impedance condition.
Figure 3:
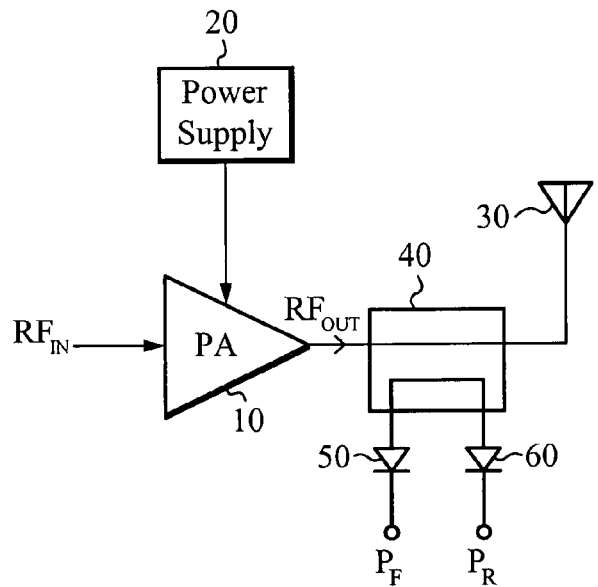
FIG. 3 illustrates a conventional circuit configuration for measuring a mismatched load impedance of a power amplifier.
Figure 4:
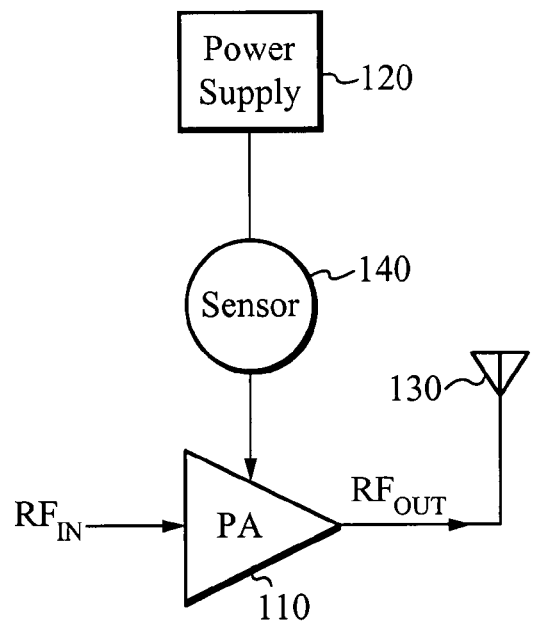
FIG. 4 illustrates a block diagram of an exemplary power amplification circuit configured to provide a normalized power output signal.

FIG. 4 illustrates a block diagram of an exemplary power amplification circuit configured to provide a normalized power output signal. A power amplifier 110 receives as input a communication signal, input signal RFIN. The power amplifier 110 is powered by a supply voltage provided by a power supply 120. A current sensor 140 is positioned between the power supply 120 and the power amplifier 110 to detect a corresponding supply current. The power amplifier 110 amplifies the input signal RFIN and outputs an amplified output signal RFOUT. An antenna 130 is coupled to the output of the power amplifier 110. The output signal RFOUT is transmitted via the antenna 130.

The power amplifier 110 is an efficient amplifier, that is the power amplifier operating in compression. The output power of the power amplifier 110 is controlled by the amount of input power supplied by the power supply 120.

Figure 5:
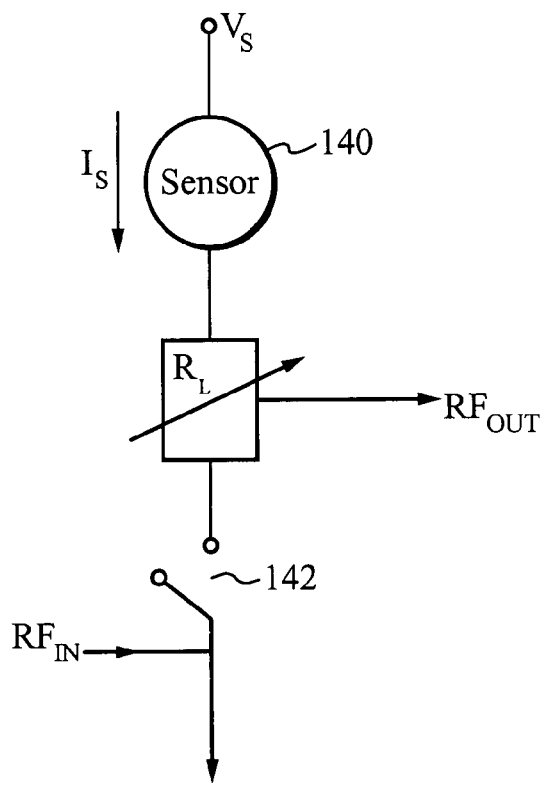
FIG. 5 illustrates a functional block diagram that approximates the power amplification circuit of FIG. 4.

Under operating conditions, the actual output load impedance experienced by the power amplifier 110 varies according to various environmental and operational conditions. As such, the actual output load impedance can be modeled as a variable resistor with a variable load resistance RL. FIG. 5 illustrates a functional block diagram that approximates the power amplification circuit of FIG. 4. The supply voltage VS represents the supply voltage provided by the power supply 120. A switch 142 represents the compressed operation of the power amplifier 110. The load resistance RL represents the actual output load impedance experience by the power amplifier 110. As the actual output load impedance varies, the load resistance RL is a variable load resistance that represents the change in the actual load impedance. The supply current IS is a function of voltage supply VS and the load resistance RL. As the load resistance RL varies, so too does the supply current IS for a given supply voltage VS. For an efficient power amplifier, the output signal power of the amplified output signal RFOUT and the supply voltage are related according to:

$$RF_{OUT} = \alpha \frac{V_S^2}{2R_L} \qquad (1)$$

$$V_S = \sqrt{\frac{RF_{OUT} \cdot 2R_L}{\alpha}} \qquad (2)$$

where $\alpha$ is a design dependent constant of the power amplifier.

Under nominal operating conditions, e.g. matched load impedance, the load resistance RL is the nominal load resistance, the supply voltage VS is set to a corresponding value, and the amplified output signal RFOUT is generated at a nominal output power level. However, under mismatched load impedance conditions, the value of the actual load resistance RL is different than the nominal load impedance. The value of the supply voltage VS needed to achieve a nominal output power of the amplified output signal RFOUT is determined according to equation (2) using the actual load resistance RL.

Due to the efficiency of the power amplifier, the relationship between the supply voltage VS and the output power RFOUT is two-directional. In a one-directional relationship, the supply voltage VS is set to a specific value, which results in a corresponding output power RFOUT. However, in a two-directional relationship, the actual value of the output power RFOUT is reflected in the input power provided to the power amplifier, which is the product of the applied supply voltage VS and the measured supply current IS. If a specific supply voltage VS is applied, and the resulting measured supply current IS is nominal, then a matched load condition at the output applies and the output power RFOUT is nominal. However, if the resulting measured supply current IS is greater than or less than the nominal supply current, then a mismatch load condition exists and the output power RFOUT is not nominal. In this case, the applied voltage supply VS is adjusted to achieve a matching condition. In this manner, the output power transmitted by the antenna is normalized to a predetermined value or within a predetermined range without use of circuitry at the output of the power amplifier.

The supply current IS and the supply voltage VS are related to the load resistance RL according to Ohm's law, e.g VS=IS*RL. As such, the power amplification circuit is designed to a nominal match condition according to a nominal load impedance. When the load resistance is the nominal load impedance and a specific supply voltage VS is applied, a corresponding specific supply current IS is expected. Under operating conditions, the load resistance RL may or may not be the nominal load impedance. When a specific supply voltage VS is applied to the power amplifier and the corresponding supply current IS is measured, if the measured supply current varies from the expected, or nominal, supply current for that specific supply voltage VS, then a mismatch load condition exists.

For an actual load resistance RL that is changing in value, the new value of the load resistance RL is determined, from which a new voltage supply VS value is determined as described above. To determine the new value of the load resistance RL, ohms law is used:

$$R_L = \frac{V_S}{\alpha I_S}. \quad (3)$$

The measured supply current IS for an applied supply voltage VS provides the actual load resistance RL.

The concept of load impedance mismatch dictates that the actual load resistance RL becomes higher or lower than the nominal load impedance depending on the phase shift in the output path of the power amplifier. This phase shift is not predictable. If the actual load resistance RL becomes lower than the nominal load resistance, then the measured supply current IS is higher than the nominal supply current. The nominal supply current is known, and in this case the measured supply current is greater that the nominal supply current because the actual load resistance RL is less than the nominal load impedance. Similarly, if the actual load resistance RL becomes greater than the nominal load resistance, then the measured supply current IS is lower than the nominal supply current because the actual load resistance RL is greater than the nominal load impedance In either case, a mismatched load condition exists. In response to determining this mismatched load condition, the supply voltage VS is adjusted to bring the product of the supply voltage VS and the supply current IS into a nominal state. The product of the supply voltage VS and the supply current IS is the input power to the power amplifier 110. This DC input power is directly related to the RF output power, as explained above.

A look-up table of nominal conditions is maintained. For example, for each supply voltage level there is a corresponding nominal supply current. The measured supply current IS is compared to the nominal supply current for a given supply voltage, as indicated in the look-up table.

In one application, the power input to the power amplifier is maintained at a constant level. Since the input power is the product of the applied supply voltage and the resulting supply current, the input power is maintained constant by maintaining a constant product of the supply voltage and the supply current. In practice, keeping the input power level constant does not result in an absolutely constant output power level due to phase shifts in the amplified output signal RFOUT. Instead, maintaining a constant input power level results in an output power level that fluctuates within a predetermined range. For many applications, an output power level within this predetermined range is acceptable.

Figure 7:
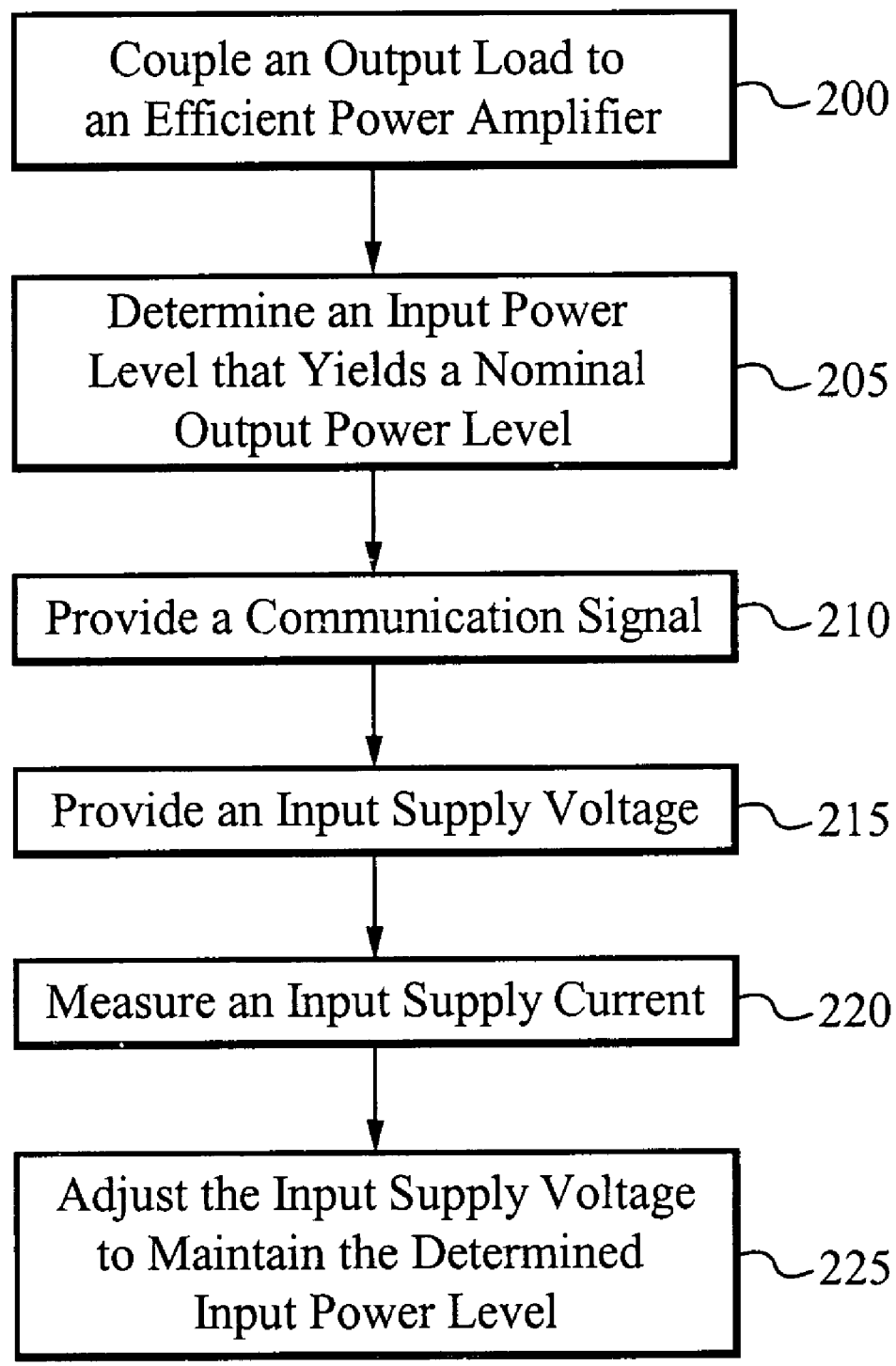
FIG. 7 illustrates a first process of normalizing a power output of an amplified signal.

FIG. 7 illustrates a first process of normalizing a power output of an amplified signal. At the step 200, an output load is coupled to an efficient power amplifier. At the step 205, an input power level that yields a nominal output power level within a defined range is determined. At the step 210, a communication signal is provided as input to the power amplifier. At the step 215, an input supply voltage is provided as input power to the power amplifier. At the step 220, an input supply current is measured at the input power supply of the power amplifier. At the step 225, the input supply voltage is adjusted to maintain the determined input power level from the step 205, thereby normalizing the output power level within the predetermined range. To maintain the determined input power level, the input supply voltage is adjusted to a level such that the product of the input supply voltage and the measured input current equals the determined input power level.

The power amplification circuit is configured to determine the amount of the load impedance mismatch. The power amplification circuit is also configured to determine which direction, high or low, the load impedance has shifted. If the measured supply current is less than the expected nominal supply current, this indicates that the load impedance has shifted higher. If the measured supply current is greater than the expected nominal supply current, this indicates that the load impedance has shifted lower. The amount and direction of the load impedance shift is used to absolutely correct for the mismatched load impedance, thereby resulting in a constant output power level. This is useful in an application where an absolute or constant output power level is desired. In such applications, additional memory is added to expand the look-up table to also include correction factors that associate the amount and direction of the actual load impedance to a specific supply voltage and specific correction factor. The specific correction factor is applied to the specific supply voltage to determine an applied supply voltage that results in a constant output power level. In such an application, the power input to the power amplifier varies slightly due to the correction factor, but the output power is constant. The power amplification circuit implements a mapping function that generates a three-dimensional mapping surface related to the supply voltages, the supply currents, and the correction factors as stored in the look-up table. The actual mapping surface is dependent on the particular design parameters of the power amplification circuit. For the previously described application where the product of the supply voltage and the supply current is maintained at a constant value, this correction factor is maintained at a constant value.

Figure 8:
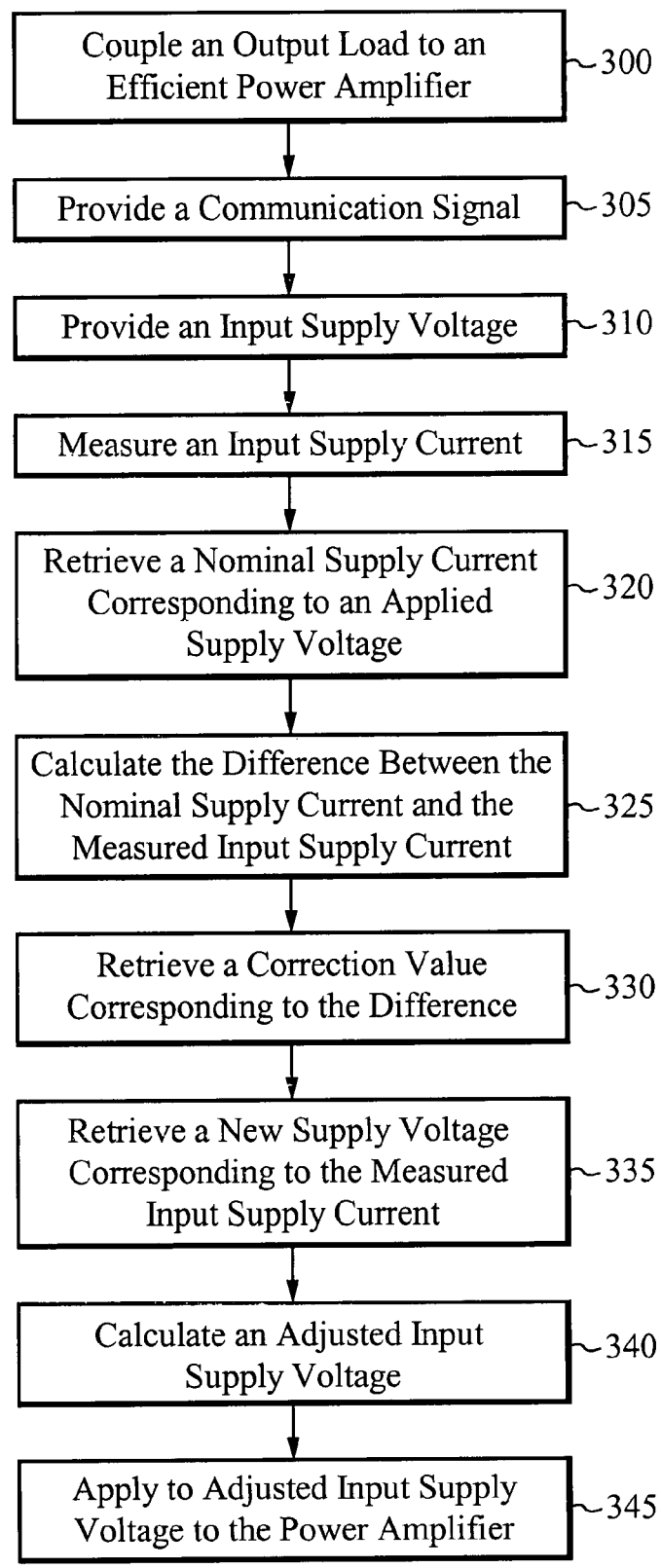
FIG. 8 illustrates a second process of normalizing a power output of an amplified signal.

FIG. 8 illustrates a second process of normalizing a power output of an amplified signal. At the step 300, an output load is coupled to an efficient power amplifier. At the step 305, a communication signal is provided as input to the power amplifier. At the step 310, an input supply voltage is provided as input power to the power amplifier. At the step 315, an input supply current is measured at the input power supply of the power amplifier. At the step 320, a nominal supply current is retrieved. Each applied supply voltage corresponds to a specific nominal supply current. At the step 325, the difference between the retrieved nominal supply current and the measured input supply current is calculated. The calculated difference includes both a magnitude and direction, such as plus or minus. At the step 330, a correction value is retrieved. The correction value corresponds to the difference calculated in the step 325. At the step 335, a new supply voltage is determined. The new supply voltage corresponds to the measured input supply current. In some embodiments, the correction value retrieved at the step 330, the nominal supply current retrieved at the step 320, and the new supply voltage retrieved at the step 335 are stored in and retrieved from a look-up table. At the step 340, an adjusted input supply voltage is calculated by applying the correction value to the new supply voltage. At the step 345, the adjusted input supply voltage is applied to the power amplifier, thereby normalizing a power output level of the power amplifier at a constant level.

In general, it is observed that the relationship between the DC input power and the RF output power of an efficient power amplifier is two-directional. As such, measuring the DC input power level determines the resulting RF output power level, and subsequently adjusting the DC input power controls the RF output power level. In particular, by measuring the supply current input to the power amplifier, and applying the relationship between the product of the supply voltage VS and the supply current IS, the output power of the amplified output signal RFOUT is normalized.

Figure 6:
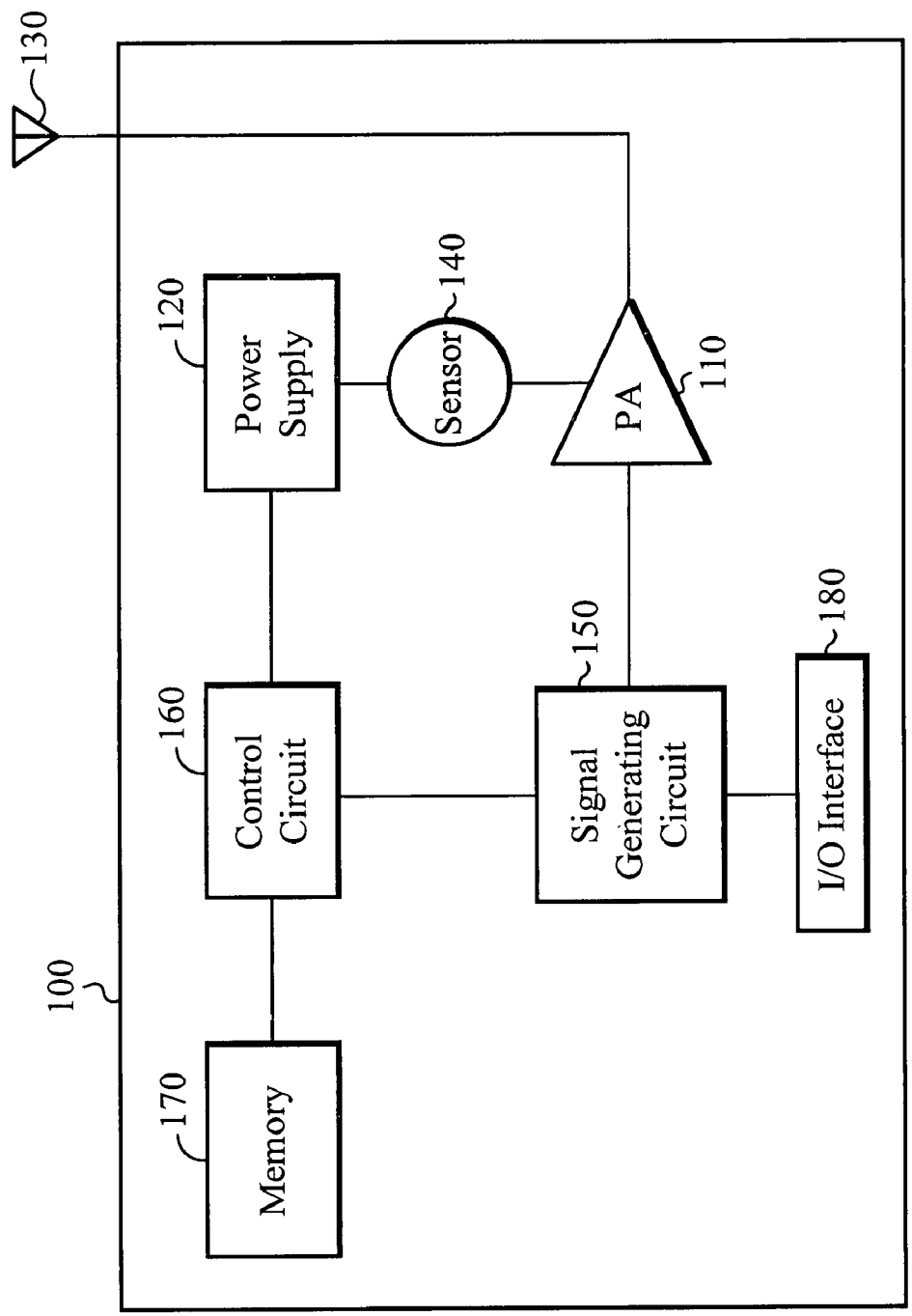
FIG. 6 illustrates a block diagram of an exemplary communication device implementing the power amplification circuit of the present invention.

FIG. 6 illustrates a block diagram of an exemplary communication device implementing the power amplification circuit of the present invention. The communication device 100 includes the power amplifier 110, the power supply 120, the antenna 130, the current sensing circuit 140, a signal generating circuit 150, a control circuit 160, a memory 170, and an input/output (I/O) interface 180. The signal generating circuit 150 generates the input signal RFIN (FIGS. 4 and 5). In general, the signal generating circuit 150 represents any conventional circuitry for generating a communication signal to be transmitted by the communication device 100. The I/O interface 180 includes any conventional input/output interfaces used to provide information due or receive information from a user of the communication device 100, or any device coupled to the communication device 100. The memory 170 stores the look-up tables, mapping function, and any other data necessary for operation of the communication device 100 and in particular, the output power leveling operation performed by the power amplification circuit, as described in detail above. The control circuit 160 includes logic circuitry for controlling the operation of the communication device 100 and in particular for controlling the power leveling operation performed by the power amplification circuit. In some embodiments, the communication device 100 is a cellular telephone.

An advantage of the power amplification circuit is that there is no need to add detection circuits in the output path of the power amplifier. This provides a significant cost savings. Additionally, all power losses resulting from the use of such detection circuits are eliminated, as well as the performance fluctuations and temperature dependencies associated with these detection circuits.

The present application has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

We claim:

1. A power amplification circuit comprising:
a power supply including a variable supply voltage and a supply current;
a power amplifier configured to receive a communication signal and the variable supply voltage from the power supply, and to output an amplified communication signal;
an antenna coupled to the output of the power amplifier;
a current sensing circuit coupled between the power supply and the power amplifier, wherein the current sensing circuit is configured to measure the supply current from the power supply to the power amplifier;
a memory configured to store a look-up table including at least a nominal supply current, a correction value and a new supply voltage; and
a control circuit configured to adjust the variable supply voltage provided by the power supply according to an amount and direction of a load impedance shift of the power amplifier, to a level such that a product of an input supply voltage and a measured input current equals a determined input power level, the amount and direction of the load impedance shift being determined based on whether the measured supply current is greater than or less than the nominal supply current retrieved from the look-up table, the input supply voltage is calculated by applying the correction value to the new supply voltage, the correction value corresponds to the difference between the measured input supply current and the retrieved nominal supply current, the new supply voltage corresponds to the measured input supply current, thereby normalizing an output power level of the amplified communication signal at a constant value.

2. A mobile communication device comprising:
a signal generating circuit configured to generate a radio frequency communication signal;
a power supply including a variable supply voltage and a supply current;
a power amplifier configured to receive the radio frequency communication signal from the signal generating circuit and the variable supply voltage from the power supply, and to output an amplified communication signal;
an antenna coupled to the output of the power amplifier;
a current sensing circuit coupled between the power supply and the power amplifier, wherein the current sensing circuit is configured to measure the supply current from the power supply to the power amplifier;

a memory configured to store a look-up table including at least a nominal supply current, a correction value and a new supply voltage; and a control circuit configured to adjust the variable supply voltage provided by the power supply according to an amount and direction of a load impedance shift of the power amplifier, to a level such that a product of an input supply voltage and a measured input current equals a determined input power level, the amount and direction of the load impedance shift being determined based on whether the measured supply current is greater than or less than the nominal supply current retrieved from the look-up table, the input supply voltage is calculated by applying the correction value to the new supply voltage, the correction value corresponds to the difference between the measured input supply current and the retrieved nominal supply current, the new supply voltage corresponds to the measured input supply current, thereby normalizing an output power level of the amplified communication signal at a constant value.

3. A method of normalizing a power output of an amplified communication signal, the method comprising:

providing a communication signal to a power amplifier;

providing a supply voltage from a power supply to the power amplifier;

measuring a supply current from the power supply to the power amplifier; and adjusting the supply voltage provided by the power supply based on a nominal supply current and the measured supply current, wherein adjusting the supply voltage further comprises:

retrieving from a look-up table stored in a memory, the nominal supply current corresponding to the supply voltage and a nominal load resistance at an output of the power amplifier;

calculating a difference between the measured supply current and the nominal supply current;

retrieving a correction value from the look-up table that corresponds to the difference between the measured supply current and the nominal supply current;

retrieving from the look-up table stored in the memory a new supply voltage that corresponds to the measured supply current; and adjusting the supply voltage provided by the power supply by applying the correction value to the new supply voltage to a level such that a product of an input supply voltage and a measured input current equals a determined input power level, thereby normalizing a power output of the amplified communication signal at a constant value.

\* \* \* \* \*